United States Patent [19]

Suzuki et al.

[11] Patent Number: 4,769,690

[45] Date of Patent: Sep. 6, 1988

[54] METALLIZING PASTE FOR SILICON CARBIDE SINTERED BODY AND A SEMICONDUCTOR DEVICE INCLUDING THE SAME

[75] Inventors: Hideo Suzuki, Katsuta; Sigeru Takahashi, Hitachioota; Shiro Iijima, Mito, all of Japan

[73] Assignee: Hitachi, Ltd., Tokyo, Japan

[21] Appl. No.: 855,468

[22] Filed: Apr. 24, 1986

[30] Foreign Application Priority Data

Apr. 25, 1985 [JP] Japan .................................. 60-89500

[51] Int. Cl.⁴ ............................................. H01L 23/48
[52] U.S. Cl. ......................................... 357/67; 357/74; 174/52 FP
[58] Field of Search ................ 357/67, 74; 174/52 FP

[56] References Cited

U.S. PATENT DOCUMENTS 4,541,003  9/1985  Otsuka et al. ........................ 357/74
4,577,056  3/1986  Butt ..................................... 357/74

FOREIGN PATENT DOCUMENTS 55-51774   4/1980  Japan .
55-113683  9/1980  Japan .

Primary Examiner—Robert S. Macon
Attorney, Agent, or Firm—Antonelli, Terry & Wands

[57] ABSTRACT

The metal powder composition for the metallizing paste is composed of not less than 90 wt % gold, 0.03–3.0 wt % cadmium, 0.1–2.0 wt % bismuth, 0.01–1.0 wt % copper, 0.01–2.0 wt % germanium and 0.01–1.0 wt % silicon.

The metallized paste bonds both the silicon carbide sintered substrate and the silicon semiconductor element with a high bonding strength.

20 Claims, 3 Drawing Sheets

METALLIZING PASTE FOR SILICON CARBIDE SINTERED BODY AND A SEMICONDUCTOR DEVICE INCLUDING THE SAME

FIELD OF THE INVENTION

The present invention relates to a novel metallizing paste for silcon carbide sintered body and, more particlularly, to a metallizing paste suitable for bonding semiconductor elements onto integrated circuit substrates made of silicon carbide sintered body and an integrated circuit device including the same.

BACKGROUND OF THE INVENTION

A thick film hybrid integrated circuit is generally composed of elements of conductors and resistors formed on a ceramic substrate by means of screen printing and firing techniques, and semiconductor elements and other electronic parts connected to the conductor or the resistor elements. As the ceramic substrate, alumina ceramics were conventionally mostly used. Recently, silicon carbide ceramics have been developed which have about 10 times as large heat conductivity as the alumina ceramics and a good electrical insulating properties as required for an integrated circuit substrate.

A metallizing paste is used in order to form a thick film hybrid integrated circuit on a ceramic sintered body. The paste is required to form a metallized portion when it is fired, which has good electrical properties, comes into close contact with the ceramic sintered body, and is wettable with solders during the bonding of the semiconductor elements, conductors and other metal connectors.

Conventionally, it is considered that a metallizing paste used for an oxide ceramic sintered body is bonded to the sintered body by a reaction of the molten glass content in the paste with the sintered body. However, the glass melt is disadvantageous in that it causes an incomplete bonding with such a system as silicon carbide sintered body having no reaction between oxides therein, and in that the glass melt hinders the bonding between conductors or other metal connectors and the metallized portion.

A metallizing method and materials for forming elements such as conductors and resistors on a non-oxide ceramic sintered body are disclosed in Japanese Patent Laid-Open Nos. 51774/1980 and 113683/1980. In these specifications, a metallizing method is proposed which includes coating a composition of a metal having a high wettability with regard to the silicon carbide and a metal having a low thermal expansion coefficient and a high melting point such as tungsten and molybdenum to the sintered body in the form of a paste, and firing the coated composition in a non-oxidizing atmosphere. This method, however, is disadvantageous in that a metal having a high melting point such as tungsten and molybdenum is difficult to directly bond with a semiconductor element and requires a material between them which bonds to both the metal and the semiconductor element, when a thick film integrated circuit is formed.

SUMMARY OF THE INVENTION

Accordingly, it is an object of the present invention to provide a metallizing paste for silicon carbide sintered body which has a good bonding with respect to both the silicon carbide ceramic sintered body and the semiconductor elements, and which is capable of bonding the semiconductor elements to the silicon carbide ceramic sintered body without the need for an intermediate layer.

A metallizing paste which has gold as its main constituent and contains a small amount of copper, germanium, bismuth and silicon exhibits a good bonding with regard to both the silicon carbide ceramic sintered body and the semiconductor elements at an ordinary temperature and reduces a thermal fatigue, but it is necessary to enhance the bonding strength in the case of applying it to a semiconductor device requiring a high reliability. Accordingly, as a result of various researches, it has been found that addition of cadmium produces a good metallizing paste in which the bonding strength is enhanced and is not lowered due to the thermal fatigue.

A gold based metallizing paste according to the present invention has a high wettability and bonding strength with semiconductor elements, retains good bonding with respect to a silicon carbide ceramic sintered body particularly having a thermal conductivity of 0.4 cal/cm.s.°C. or more (at a room temperature) and a thermal expansion coefficient of $4 \times 10^{-6}$/°C. or less (at a room temperature), a good electrical insulating property, and, in addition, the paste is superior in resistance to thermal fatigue.

A metallizing paste according to the present invention is characterized in that mixed powder, the main constituent of which is powder of gold and which contains a small amount of cadmium, and further preferably at least one selected from the group consisting of bismuth and copper, or a small amount of germanium, is dispersed uniformly in an organic binder solution. The metallizing paste of the present invention optinally may contain silicon.

The present invention is based on the discovery that the addition of cadmium enhances the bonding strength with silicon carbide ceramic sintered body, and increases resistance to thermal fatigue. In the present invention, cadmium powder, as well as copper and bismuth powder, fuses with the silicon oxide film formed in advance on the surface of a silicon carbide ceramic sintered body and vitrifies at the time of firing, thereby bonding fast the interface between the ceramic and the gold metallized portion. Germanium powder increases the wettability with silicon at the time of bonding the silicon elements and strengthens the bonding. Silicon may be added to the above-described paste composition. Addition of the silicon is advantageous in enhancing the wettability with respect to the semiconductor elements and suppressing the deterioration of the properties due to thermal fatigue after bonding.

The metal powder composition of the metallizing paste according to the present invention essentially is composed of not less than 90 wt %, preferably 99.87 to 93 wt % gold, which is the main constituent, and 0.01 to 2.0 wt %, preferably 0.05 to 1.0 wt % cadmium, and further preferably composed of at least one selected from the group consisting of 0.01 to 2.0 wt % bismuth, 0.01 to 2.0 wt % germanium and 0.01 to 1.0 wt % copper. The metal powder may contain 0.01 to 1.0 wt % silicon. The above-described contents of copper, germanium and cadmium are preferable for improving the bonding with the silcion carbide ceramic sintered body and the formation of a thick film. Copper improves bonding with the semiconductor elements, germanium improves the bonding with the sintered body and cadmium improves the bonding with the sintered body and serves for a better formation of a thick film.

The particle size of the metal powder used for the present invention is about 5 μm or less, and the finer the particle, the better, but powder having a particle size of about 0.005 to 5 μm is sufficient.

As an organic binder in the present invention, a compound which easily decomposes and volatiles completely under the firing condition, for example a cellulose derivative such as ethylcellulose and nitrocellolose, and a polymer such as methacrylic acid ester and acrylic aicd ester is used. Furthermore, in the present invention, an organic solvent which dissolves the binder and wets the above-described metal powder is used. Glycol ether ester, ketone and terpineol are examples for the organic solvent.

A mixing amount of the organic binder and the solvent is selected with due consideration of necessary working ease in the steps from printing the paste to firing thereof, and, for example, 1 to 15 parts by weight of ethylcellulose and 100 parts by weight of terpineol are mixed with 100 parts by weight of the metal powder composition. A method of preparing the paste is not restricted and a uniform dispersed body is obtained through a conventional equipment by mulling the metal powers mixed in advance and the organic binder solution, or by adding and mixing metal powers into the organic binder solution. The powder is preferably composed of 0.1 to 2.0 wt % Bi, 0.01 to 2.0 wt % Ge, 0.01 to 1.0 wt % Cu, 0.03 to 2.0 wt % Cd and the balance Au, or further composed of 0.01 to 1.0 wt % Si.

A metallizing paste according to the present invention is applied to a silicon carbide ceramic sintered body by a known technique and is fired. The firing is preferably conducted at a temperature of 750° C. to 950° C., which is lower than the melting temperature of gold, more preferably 830° to 880° C., in compressed air. The firing of the paste in the oxidizing atmospheres contributes to form an Au metallized layer of a high bonding strength more than 1.5 kg/5 mm in peel strength, wherein the cadmium in the paste oxidized into cadmium oxide at the interface with the sintered body and which reacts with the silicon oxide likely formed at the interface between the silicon carbide ceramic sintered body and the paste and strengthens the bonding. A small amount of oxide remaining in the Au metallized layer does not cause any substantial adverse effects to the bonding strength thereof. The other additives, that is, bismuth and copper also react with the silicon oxide and strengthen the bonding.

A metallizing paste in accordance with the present invention is applicable not only to formation of a thick film hybrid integrated circuit but also to binders for structural portions of machines.

A silicon carbide sintered body is preferably an electrical insulating sintered body containing Be, a Be compound or BN, and preferably has a resistivity of $10^{10} \Omega$ cm or more and a thermal conductivity of 0.2 cal/cm sec °C. or more at a room temperature. Especially, the sintered body preferably contains 0.1 to 3.5 wt % Be or Be compound based on Be content.

A theoretical density of the silicon carbide ceramic sintered body is to be more than 90%, preferably more than 98%.

A semiconduetor package of the present invention comprising a semiconductor element disposed on a substrate made of an electrical insulating silicon carbide sintered body; a spacer disposed on the substrate and surrounding the semiconductor element; a lead frame arranged on the spacer; a fine wire electrically connecting the semiconductor element and the lead frame; a flange arranged on the lead frame; and a cap arranged on the flange so as to seal the semiconductor element: characterized in that the semiconductor element is bonded to the substrate by a metallized layer containing gold as it's main constituent and a small amount of cadmium.

A semiconductor module of the present invention comprising a semiconductor element, a thick film resistance element, a capacitance element, and a thick film electrical conductor disposed respectively on a substrate made of an electrical insulating silicon carbide sintered body; and a fine metal wire electrically connecting the semiconductor, thick film resistance and capacitance elements and the thick film electrical conductor: characterized in that the semiconductor element is bonded to the substrate by a metallized layer containing gold as it's main constituent and a small amount of cadmium.

A semiconductor package of the present invention comprising a semiconductor element and a lead frame disposed on a substrate made of an electrical insulating silicon carbide sintered body; a fine metal wire electrically connecting the semiconductor element and the lead frame; and a cap arranged on the lead frame so as to cover and seal the semiconductor element therein: characterized in that the semiconductor element is bonded to the substrate by a metallized layer containing gold as it's main constituent and a small amount of cadmium, the semiconductor package of the present invention is further characterized in that a comb shaped heat radiation fin is formed integrally on the other side of the substrate where the semiconductor element is not disposed, the semiconductor package of the present invention is still further characterized in that a heat sink with metal heat radiation fins is bonded through a resin on the other side of the substrate where the semiconductor element is not disposed.

A pin grid alley semiconductor device of the present invention comprising a semiconductor element disposed on a substrate made of an electrical insulating silicon carbide sintered body; a wiring substrate disposed on the substrate and surrounding the semiconductor element; a metal wire electrically connecting the semiconductor element and a terminal provided on the wiring substrate; a cap arranged on the wiring substrate so as to cover and seal the semiconductor element; and a pin for electrical connection arranged on the other side of the wiring substrate not facing to the substrate for the semiconductor element: characterized in that the semiconductor element is bonded to the substrate by a metallized layer containing gold as it's main constituent and a small amount of cadmium, the pin grid alley semiconductor device of the present invention is further characterized in that the wiring substrate is a multilayered board made of ceramic sintered body one selected from the group consisting of alumina, mullite based and silica glass based sintered body.

A semiconductor device of the present invention comprising a semiconductor element disposed on a substrate made of an electrical insulating silicon carbide sintered body characterized in that the semiconductor element is bonded to the substrate by a metallized layer containing gold as it's main constituent and a small amount of cadmium, and an oxide layer of cadmium and silicon is formed at the interface between the substrate and the metallized layer, and further characterized in that the metallized layer is essentially composed of not less than 90 wt % gold and 0.03-3.0 wt % cadmium, preferably 0.1 wt % cadmium.

A semiconductor device of the present invention comprising a semiconductor element disposed on a substrate made of an electrical insulating silicon carbide sintered body characterized in that the semiconductor element is bonded to the substrate by a metallizing layer containing gold as it's main constituent, a small amount of cadmium and at least one selected from the group consisting of a small amount of bismuth, copper, germanium and silicon and an oxide layer of cadmium and silicon is formed at the interface between the substrate and the metallized layer, and further characterized in that the metallized layer is essentially composed of not less than 90 wt % gold, 0.03-3.0 wt % cadmium and at least one selected from the group consisting of 0.1-2.0 wt % bismuth, 0.01-1.0 wt % copper, 0.01-2.0 wt % germanium and 0.01-1.0 wt % silicon, and still futher characterized in that the metallized layer is essentially composed of not less than 90 wt % gold, 0.03-3.0 wt % cadminum, 0.1-2.0 wt % bismuth, and 0.01-1.0 wt % copper, preferably not less than 90 wt % gold, 0.03-3.0 wt % cadmium, 0.1-2.0 wt % bismuth, 0.01-1.0 wt % copper and 0.01-2.0 wt % germanium.

EMBODIMENT 1

Figure 1:
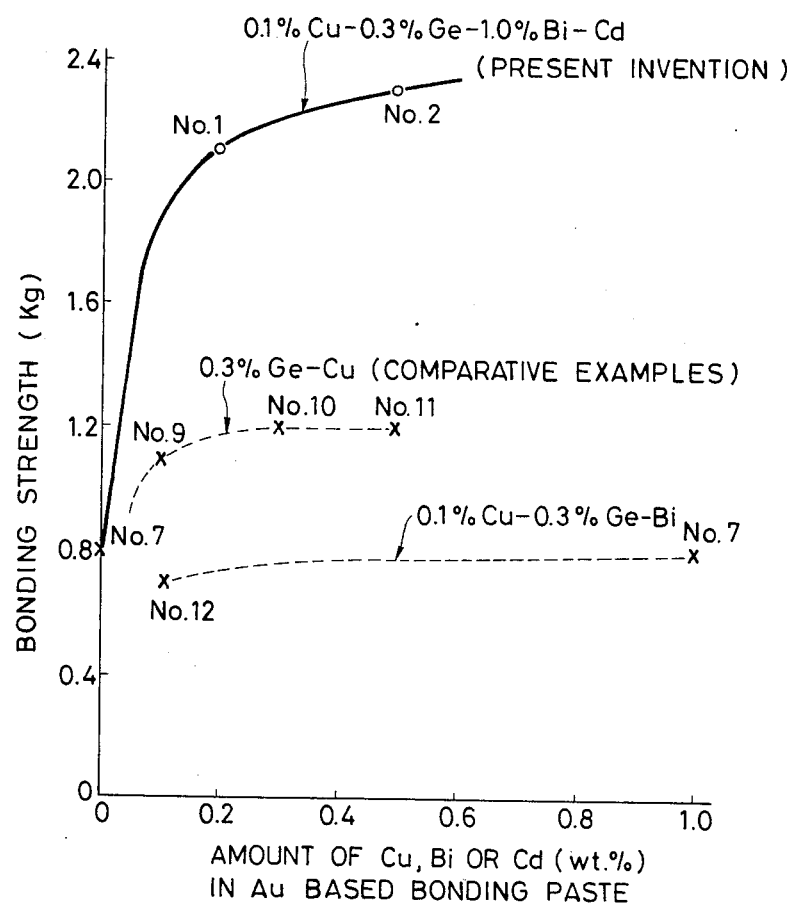
FIG. 1 shows a graph illustrating bonding strengths of metallized layers in relation to the amount of copper, bismuth or cadmium in gold based bonding pastes of the present invention and comparative examples.

Powder metal components of a particle diameter of about 1 μm for respective metallizing paste compositions as shown in Table 1 are weighed out and mixed by a V-type mixer.

TABLE 1

| | No. | Au | Cu | Ge | Bi | Si | Cd |
|---|---|---|---|---|---|---|---|
| Embodiments | 1 | 98.4 | 0.1 | 0.3 | 1.0 | — | 0.2 |
| | 2 | 98.1 | 0.1 | 0.3 | 1.0 | — | 0.5 |
| | 3 | 98.8 | 0.2 | 0.3 | 0.5 | — | 0.2 |
| | 4 | 98.5 | 0.2 | 0.3 | 0.5 | 0.3 | 0.2 |

TABLE 1-continued

| | No. | Au | Cu | Ge | Bi | Si | Cd |
|---|---|---|---|---|---|---|---|
| Comparative | 5 | 98.5 | 0.1 | 0.3 | 1.0 | 0.1 | — |
| Examples | 6 | 98.7 | 0.2 | 0.3 | 1.0 | 0.5 | — |
| | 7 | 98.6 | 0.1 | 0.3 | 1.0 | — | — |
| | 8 | 99.0 | 0.2 | 0.3 | 0.5 | — | — |
| | 9 | 99.6 | 0.1 | 0.3 | — | — | — |
| | 10 | 99.4 | 0.3 | 0.3 | — | — | — |
| | 11 | 99.2 | 0.5 | 0.3 | — | — | — |
| | 12 | 99.1 | 0.1 | 0.3 | 0.5 | — | — |

Terpineol solution which contains ethyl cellulose of a concentration of 5 wt % as an organic binder is added to the metal powder mixture in the proportion of 100 parts by weight of the metal content to 20 parts by weight of terpinelo, and they are mulled to prepare a slurry metallizing paste.

The metallizing paste is next screen printed on a silicon carbide sintered ceramic substrate containing 2 wt % beryllia and having a theoretical density of 99% and degreased and washed in advance, heated and dried in an atmosphere at 120° C. for 15 minutes, and thereafter fired at 800° to 870° C. for 9 minutes.

The sample prepared in this way was examined in the following method in order to evaluate the bonding state between the metallized portion and the substrate.

The metallized portion of 7 mm square and 12 μm in thickness was formed on the above silicon carbide ceramic substrate of 21.6 mm square and 0.6 mm in thickness. A copper belt of 5 mm in width and 0.2 mm in thickness was bonded to the metallized portion by the solder of an indium alloy containing 50% by weight of lead. When soldering, the lead-indium alloy was heated and fused in a solder pan to 230° to 250° C. in advance, the metallized portion with the copper belt overlaid was immersed in the solder pan for 2 to 3 seconds for bonding. The test piece was loaded on a tensile tester by means of a jig while fixing the substrate and the bonding strength (kg) at 5 mm width was measured by peeling the metallized portion out of the substrate by pulling one end of the copper belt. The results are shown in Table 2 as a. In order to examine the bonding state between the metallized portion and the substrate under a thermal fatigue, a thermal shock test and a heat cycle test were conducted under the following conditions and the bonding strength of the test pieces after the tests was measured.

In the thermal shock test, the test piece was heated to 200° C. on a preheated heating block, immediately thereafter, it was put into ice water (0° C.) and retained for 5 minutes, and was again placed on the heating block. This cycle was repeated 5 times.

In the heat cycle test, the test piece was maintained for 25 minutes in a bath in which the temperature was set at −55° C., was left to stand at a room temperature for 5 minutes, maintained for 25 minutes in a constant temperature bath of 150° C., and was left to stand at a room temperature for 5 minutes. The test piece was subjected to 100 cycles of this heat cycle test.

The bonding strength (kg) of the test piece after exposure to the thermal fatigue was measured by peeling the bonding between the metallized portion and the substrate through the method explained above. The results are shown in Table 2 as b and c, respectively. On the comparative examples, the bonding strengths were measured in the same way as explained. In Table 2, a denotes the data of the test piece immediately after firing, b those of the test piece after the thermal shock test, and
c those of the test piece after the heat cycle test.

An oxide layer of at least cadmium and silicon of below 10 μm in thickness was formed at the interface between the silicon carbide sintered substrate and the metallized layer.

As seen from Table 2, the peel strength (a) of the metallized layer imediately after firing according to the preseut invention showed more than 1.9 kg. On the other hand the peel strength (a) of the metallized layer of the comparative examples showed 1.2 kg at the maximum.

Further as seen from FIG. 1, the metallized layer using the metallizing paste containing more than 0.05 wt % cadmium according to the present invention shows a high bonding strength more than 1.5 kg, which is understood that the addition of cadmium into the gold based metallizing paste extremely improve the bonding strength of the metallized layer.

Still further, the inventors confirmed that a sole addition of cadmium to the gold based metallizing paste also increases the bonding strength of the metallized layer although which is not indicated in Table 2.

The bonding of the metallized portion with a semiconductor element was evaluated by the following method.

A silicon semiconductor element (5.0 mm × 5.0 mm in bottom size) was placed on the metallized portion (7 mm × 7 mm in size, and 12 μm in thickness) formed on a silicon carbide ceramic substrate, which was placed on a heater to be heated to about 430° C. Nitrogen gas which was heated to about 390° C. was blown onto the substrate to isolate the substrate from the surroundings. In this atmosphere, the element was pressed against the substrate, and bonded to the metallized portion through a formation of an Au-Si alloy.

A test piece was formed by adhering a 3 mmφ nut and bolt to the semiconductor element which was bonded to the metallized portion using an epoxy resin. The test piece was loaded on a tensile tester by a jig while fixing the substrate and the bonding strength (kg) between the metallized portion and the semiconductor element was measured. The results are shown in Table 3. a denotes the data of the test piece imediately afte the semiconductor was bonded to the metallized portion. On the comparative examples the same bonding strength was measured and illustrated in Table 3. To examine the bonding state of the test piece after exposed in a thermal fatigue, a thermal shock test and a heat cycle test were conducted. Both tests were conducted in the same methods as described above, and the bonding strength (kg) between the metallized portion and the semiconductor of the test pieces was measured in the same method as explained above. The results are shown in Table 3 as b and c. In Table 3, b shows the data after the thermal shock test and c the data after the heat cycle test. On the comparative examples the same bonding strengths were measured and illustrated in Table 3.

EMBODIMENT 2

Application examples to a semiconductor device employing the electrical insulating silicon carbide sintered body as it's substrate which includes the metallized layer formed thereon by using the gold based metallizing paste according to the present invention will be explained in the following.

TABLE 2

| | No. | Bonding strength | | |
| --- | --- | --- | --- | --- |
| | | a | b | c |
| Enbodiments | 1 | 2.1 | 1.75 | 1.9 |
| | 2 | 2.3 | 2.05 | 2.0 |
| | 3 | 2.0 | 1.7 | 1.7 |
| | 4 | 1.9 | 1.6 | 1.8 |
| Comparative Examples | 5 | 0.9 | 1.1 | 1.0 |
| | 6 | 1.0 | 1.6 | 1.5 |
| | 7 | 0.8 | 0.6 | 1.0 |
| | 8 | 0.85 | 0.8 | 0.75 |
| | 9 | 1.1 | — | — |
| | 10 | 1.2 | — | — |
| | 11 | 1.2 | — | — |
| | 12 | 0.7 | — | — |

TABLE 3

| | No. | Bonding strength | | |
| --- | --- | --- | --- | --- |
| | | a | b | c |
| Enbodiments | 1 | 7.2 | 5.0 | 6.0 |
| | 2 | 8.4 | 7.2 | 7.6 |
| | 3 | 7.4 | 6.4 | 7.0 |
| | 4 | 8.0 | 7.0 | 7.2 |
| Comparative Examples | 5 | 1.8 | 1.5 | 1.7 |
| | 6 | 1.6 | 2.4 | 2.8 |
| | 7 | 1.4 | 1.1 | 1.2 |
| | 8 | 0.7 | 0.6 | 0.6 |

Figure 2:
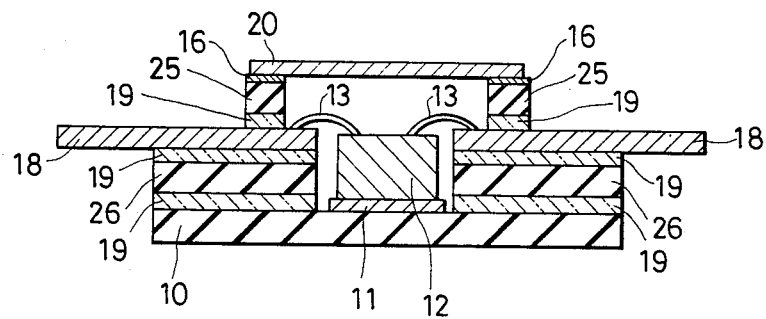
FIG. 2 is a sectional view of one empodyment of a semiconductor package including a silicon carbide sintered substrate using a metallizing paste according to the present invention.

FIG. 2 is a sectional view of a semiconductor package formed by using the gold based metallizing paste according to the present invention. This semiconductor device is fabricated, by forming the metallized layer 11 on the substrate 10 of the silicon carbide sintered body described in Embodiment 1 by firing it at a temperature of 850° C. in an atmosphere using the paste No. 2 shown in Table 1, and bonding the silicon semiconductor element 12 directly onto the metallized layer 11. A flange 25, lead frame 18, a spacer 26 and the silicon carbide sintered body substrate 10 are respectively bonded by glasses 19 having a thermal expansion coefficient of 40 to $55 \times 10^{-7}$/°C. and sealed. The flange and the spacer are preferably made of a ceramic sintered body having a thermal expansion coefficient of 40 to $55 \times 10^{-7}$/°C., and, for example, Zircon sintered body ($ZrO_2 \cdot SiO_2$) is preferable. The cap 20 and the flange 25 are bonded by the solder 16. Kovar (30 wt % Ni-17 wt % Co-Fe alloy) or 42 alloy (42 wt % Ni-Fe alloy) is used for the cap 20. The reference numeral 13 represents a bonding wire. Au, Cu or Al is preferable as the wire.

Figure 3:
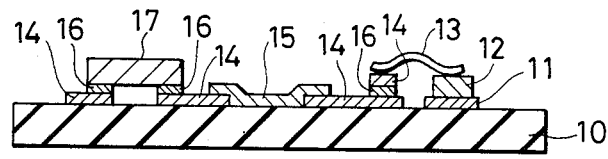
FIG. 3 is a sectional view of one embodyment of a semiconductor module including a silicon carbide sintered substrate using a metallizing paste according to the present invention.

FIG. 3 is a sectional view of a semiconductor igniter module. This semiconductor device is fabricated by forming a metallized layer 11 on a substrate 10 of the electrical insulating silicon carbide sintered body described in Embodiment 1 by firing it at a temperature of 850° C. in an atmosphere using the paste No. 2 shown in Table 1. A silicon pellet 12 is disposed on the metallized layer 11 and bonded thereto by pressing the pellet 12. A capacitor 17 is directly bonded to a thick film conductor 14 by a solder 16. The reference numeral 15 denotes a thick film resistor and 13 a bonding wire. This wire is preferably made of Al.

Figure 4:
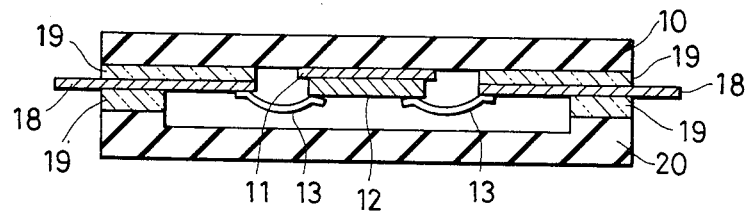
FIG. 4 is a sectinal view of one embodyment of a logic LSI package including a silicon carbide sintered substrate using a metallizing paste according to the present invention.

FIG. 4 is a sectional view of one embodiment of a logic LSI package without a heat radiation fin formed by using the gold based metallizing paste according to the present invention. In the same way as described before, the metallized layer 11 using the paste No. 2 shown in Table 1 is formed on the substrate 10 of silicon carbide sintered body. A silicon semiconductor element 12 is directly bonded to the metallized layer 11 in the same way as described in Embodiment 1. A lead frame 18 and the substrate 10 and a cap 20 are bonded by glass 19 having a thermal expansion coefficient of $55 \times 10^{-7}/°C.$ and sealed. Ceramics are used for the cap 20.

Figure 5:
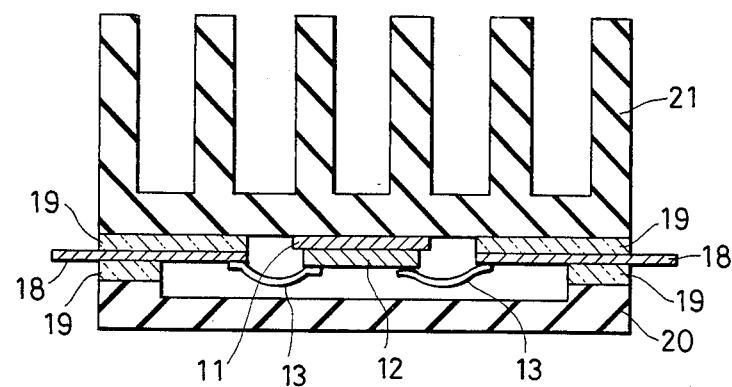
FIG. 5 is a sectional view of another embodyment of a logic LSI package including a silicon carbide sintered substrated using a metallizing paste according to the present invention.

FIG. 5 is a sectional view of another embodiment of logic LSI package which is provided with a heat radiation fin made of the electrical insulating silicon carbide sintered body. The metallized layer 11 using paste No. 2 shown in Table 1 is provided on the silicon cabide sintered body with the heat radiation fin 21 and an silicon carbide semiconductor elememt 12 is directly bonded thereon. A lead frame 18, and the silicon carbide sintered substrate with the heat radiation fin 21 and a cap 20 are respectively sealed by glass having a thermal expansion coefficient of 40 to $55 \times 10^{-7}/°C.$ The cap 20 is preferably made of ceramics and the bonding wire is preferably made of Al.

Figure 6:
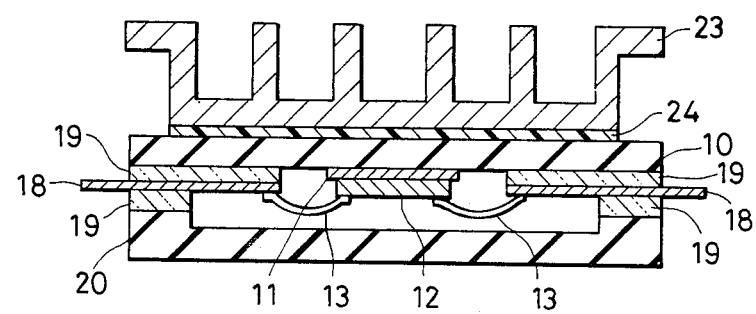
FIG. 6 is a sectional view of still further embodiment of a logic LSI package including a silicon carbide sintered substrate using a metallizing paste according to the present invention.

FIG. 6 is a sectional view of still another embodyment of a logic LSI package formed by using the gold based metallizing paste according to the present invention, which is provided with a heat sink 23 made of Al. This example is the same as that shown in FIG. 5 except that the heat sink 23 is bonded to the substrate 10 of the silicon carbide sintered body by a resin 24.

Figure 7:
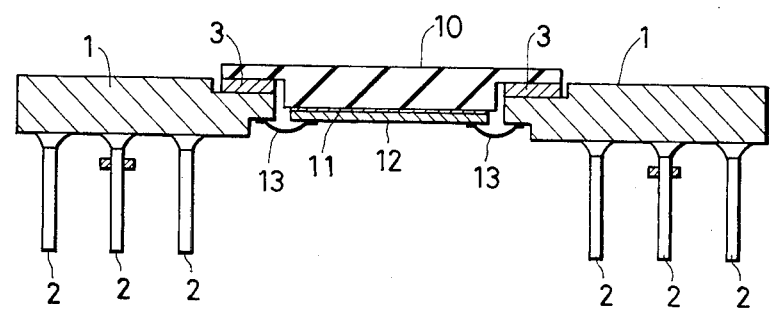
FIG. 7 is a sectional view of one embodyment of a pin grid alley semiconductor device including a silicon carbide sintered substrate using a metallizing paste according to the present invention.

FIG. 7 is a sectional view of one embodyment of a pin grid alley semiconductor device including a silicon carbide sintered substrate using a metallizing paste according to the present invention. A ceramic multilayered wiring board 1 together with a silicon semiconductor element 12 are disposed on the substrate 10 made of electrical insulating silicon carbide sintered body. The silicon semiconductor element 12 is bonded to the substrate 10 through a metallized layer 11 formed by using the paste No. 2 shown in Table 1. The silicon semiconductor element 12 is connected to the ceramic multilayered wiring board 1 through a fine wire 13. The multilayered wiring board is provided with metal pins 2 for external connection, preferably made of ceramic sintered body one selected from the group consisting of alumina, mullite based and silica glass based sintered body, and bonded to the substrate 10 by a solder 3 by forming metallized layers on respective facing surfaces.

According to the present invention, since cadmium is mixed in the paste and a cadmium oxide layer is formed at the interfaces between the metallized layer and the silicon carbide sintered substrate and the silicon semiconductor element, whereby the bonding between the metallized layer and a semiconductor element is effectively strengthened and deterioration of the properties of the metallized layer due to thermal fatigue after bonding to the semiconductor is restrained. Furthermore, the metallizing paste according to the present invention which has gold as the main constituent and contains cadmium, bismuth, copper and germanium is very useful for forming a thick film hybrid integrated circuit using silicon carbide sintered ceramic body as its substrate.

We claim:

1. A metallizing paste for silicon carbide sintered body essentially composed of:
   mixed powder which has powder of gold as the main constituent thereof and a small amount of cadmium; and
   an organic binder solution in which said mixed powder is uniformly dispersed.

2. The metallizing paste for silicon carbide sintered body according to claim 1, wherein said mixed powder is essentially composed of not less than 90 wt % gold and 0.03-3.0 wt % cadmium.

3. A metallizing paste for silicon carbide sintered body essentially composed of
   mixed powder which has powder of gold as the main constituent thereof and further contains a small amount of cadmium, a small amount of bismuth, a small amount of copper and a small amount of germanium; and
   an organic binder solution in which said mixed powder is uniformly dispersed.

4. A metallizing paste for silicon carbide sintered body according to claim 3, wherein said mixed powder is essentially composed of not less, than 90 wt % gold, 0.03 to 3.0 wt % cadmium, 0.1 to 20. wt % bismuth and 0.01 to 1.0 wt % copper.

5. A metallizing paste for silicon carbide sintered body according to claim 3, wherein said mixed powder is essentially composed of not less than 90 wt % gold, 0.03 to 2.0 wt % cadmium. 0.1 to 2.0 wt % bismuth, 0.01 to 1.0 wt % copper and 0.01 to 2.0 wt % germanium.

6. A metallizing paste for silicon carbide sintered body comprising:
   mixed powder which has powder of gold as the main constituent thereof and contains a small amount of cadmium, a small amount of bismuth, a small amount of copper, a small amount of germanium, and a small amount of silicon; and
   an organic binder solution in which said mixed powder is uniformly dispersed.

7. A metallizig paste for silicon carbide sintered body according to claim 6, wherein said mixed powder is composed of not less than 90 wt % gold, 0.03 to 2.0 wt % cadmium, 0.1 to 2.0 wt % bismuth, 0.01 to 2.0 wt % germanium 0.01 to 1.0 wt % copper, and 0.01 to 1.0 wt % silicon.

8. A semiconductor package comprising a semiconductor element (12) disposed on a substrate (10) made of an electrical insulating silicon carbide sintered body; a spacer (26) disposed on said substrate (10) and surrounding semiconductor element (12); a lead frame (18) arranged on said spacer (26); a fine wire (13) electrically connecting said semiconductor element (12) and said lead frame (18); a flange (25) arranged on said lead frame (18); and a cap (20) arranged on said flange (25) so as to seal said semiconductor element (12): characterized in that said semiconductor element (12) is bonded to said substrate (10) by a metallized layer (11) containing gold as it's main constituent and a small amount of cadmium.

9. A semiconductor module comprising a semiconductor element (12) a thick film resistance element (15), a capacitance element (17) and a thick film electrical conductor (14) disposed respectively on a substrate made of an electrical insulating silicon carbide sintered body; and a fine metal wire (13) electrically connecting said semiconductor; thick film resistance and capacitance elements (12, 15, 17) and said thick film electrical conductor (14): characterized in that said semiconductor element (12) is bonded to said substrate (10) by a metallized layer (11) containing gold as it's main constituent and a small amount of cadmium.

10. A semiconductor package comprising a semiconductor element (12) and a lead frame (18) disposed on a substrate (10) made of an electrical insulating silicon carbide sintered body; a fine metal wire (13) electrically connecting said semiconductor element (12) and said lead frame (18); and a cap (20) arranged on said lead frame (18) so as to cover and seal said semiconductor element (12) therein: characterized in that said semiconductor element (12) is bonded to said substrate (10) by a metallized layer (11) containing gold as its main constituent and a small amount of cadmium.

11. The semiconductor package according to claim 10 further characterized in that a comb shaped heat radiation fin (21) is formed integrally on the other side of said substrate (10) where said semiconductor element (12) is not disposed.

12. The semiconductor package according to claim 10 further characterized in that a heat sink (23) with metal heat radiation fins is bonded through a resin (24) on the other side of said substrate (10) where said semiconductor element (12) is not disposed.

13. A pin grid alley semiconductor device comprising a semiconductor element (12) disposed on a substrate (10) made of an electrical insulating silicon carbide sintered body; a wiring substrate (1) disposed on said substrate (10) and surrounding said semiconductor element (12) a metal wire (13) electrically connecting said semiconductor element (12) and a terminal provided on said wiring substrate (1); a cap arranged on said wiring substrate so as to cover and seal said semiconductor element (12); and a pin (2) for electrical connection arranged on the other side of said wiring substrate (1) not facing to said substrate (10) for said semiconductor element (12): characterized in that said semiconductor element (12) is bonded to said substrate (10) by a metallized layer (11) containing gold as its main constituent and a small amount of cadmium.

14. The pin grid alley semiconductor device according to claim 13 further characterized in that said wiring substrate (1) is a multilayered board made of ceramic sintered body one selected from the group consisting of alumina, mullite based and silica glass based sintered body.

15. A semiconductor device comprising a semiconductor element disposed on a substrate made of an electrical insulating silicon carbide sintered body characterized in that said semiconductor element is bonded to said substrate by a metallized layer containing gold as it's main constituent and a small amount of cadmium, and an oxide layer of cadmium and silicon is formed at the interface between said substrate and said metallized layer.

16. The semiconductor device according to claim 15; characterized in that the metallized layer is essentially composed of not less than 90 wt % gold and 0.03–3.0 wt % cadmium.

17. A semiconductor device comprising a semiconductor element disposed on a substrate made of an electrical insulating silicon carbide sintered body characterized in that said semiconductor element is bonded to said substrate by a metallized layer containing gold as it's main constituent, a small amount of cadmium and at least one selected from the group consisting of a small amount of bismuth, copper, germanium and silicon and an oxide layer of cadmium and silicon is formed at the interface between said substrate and said metallized layer.

18. The semiconductor device according to claim 17, further characterized in that said metallized layer is essentially composed of not less than 90 wt % gold, 0.03–3.0 wt % cadmium and at least one selected from the group consisting of 0.1–2.0 wt % bismuth, 0.01–1.0 wt % copper, 0.01–2.0 wt % germanium and 0.01–1.0 wt % silicon.

19. The semiconductor device according to claim 17 further characterized in that said metallized layer is essentially composed of not less than 90 wt % gold, 0.03–3.0% cadnium, 0.1–2.0 wt % bismuth and 0.01–1.0 wt % copper.

20. The semiconductor device according to claim 17 further characterized in that said metallized layer is essentially composed of not less than 90 wt % gold, 0.03–2.0 wt % cadimium, 0.1–2.0 wt % bismuth, 0.01–1.0 wt % copper and 0.01–2.0 wt % germanium.

* * * * *